United States Patent
Kitada et al.

(10) Patent No.: US 12,339,179 B2
(45) Date of Patent: Jun. 24, 2025

(54) ELECTRONIC DEVICE

(71) Applicant: Murata Manufacturing Co., Ltd., Nagaokakyo (JP)

(72) Inventors: Hiroaki Kitada, Nagaokakyo (JP); Hidekazu Kano, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/790,428

(22) Filed: Jul. 31, 2024

(65) Prior Publication Data

US 2024/0385061 A1    Nov. 21, 2024

Related U.S. Application Data

(63) Continuation of application No. PCT/JP2023/004157, filed on Feb. 8, 2023.

(30) Foreign Application Priority Data

Feb. 10, 2022  (JP) .................. 2022-019246

(51) Int. Cl.
  *G01L 1/16* (2006.01)
  *G06F 3/01* (2006.01)
  *H10N 30/30* (2023.01)

(52) U.S. Cl.
  CPC .................. *G01L 1/16* (2013.01); *G06F 3/01* (2013.01); *H10N 30/302* (2023.02)

(58) Field of Classification Search
  CPC ........... G01L 1/16; G06F 3/01; H10N 30/302; H10N 30/87
  See application file for complete search history.

(56) References Cited

U.S. PATENT DOCUMENTS

| | | | |
|---|---|---|---|
| 10,381,546 B2 | 8/2019 | Kou et al. | |
| 10,534,463 B2 | 1/2020 | Kim et al. | |
| 10,788,912 B2 | 9/2020 | Kuo et al. | |
| 12,067,801 B2 * | 8/2024 | Jo | H04M 1/0266 |

(Continued)

FOREIGN PATENT DOCUMENTS

| | | |
|---|---|---|
| JP | 2015-190863 A | 11/2015 |
| JP | 2015-215820 A | 12/2015 |

(Continued)

OTHER PUBLICATIONS

International Search Report received for PCT Patent Application No. PCT/JP2023/004157, mailed on Apr. 11, 2023, 2 pages (English Translation Only).

*Primary Examiner* — Pegeman Karimi
(74) *Attorney, Agent, or Firm* — ArentFox Schiff LLP

(57) ABSTRACT

An electronic device that includes: an operation panel having an upper main surface and a lower main surface; a buffer member that has an upper main surface and a lower main surface, and is fixed to the lower main surface of the operation panel; a plate-shaped member that has an upper main surface and a lower main surface, and is fixed to the lower main surface of the buffer member; and a sensor that is fixed to the lower main surface of the plate-shaped member and detects deformation of the operation panel. A value of a product of a Young's modulus of the plate-shaped member and a cube of a thickness of the plate-shaped member is $1.6 \times 10^{-3}$ N·m to 1.6 N·m.

13 Claims, 4 Drawing Sheets

(56) References Cited

U.S. PATENT DOCUMENTS

| | | | |
|---|---|---|---|
| 2015/0268766 A1* | 9/2015 | Kim | G06F 3/0486 |
| | | | 345/174 |
| 2017/0033276 A1* | 2/2017 | Kou | H10N 30/30 |
| 2018/0143718 A1* | 5/2018 | Kim | G06F 3/0447 |
| 2019/0107897 A1 | 4/2019 | Ou et al. | |
| 2020/0050307 A1 | 2/2020 | Kuo et al. | |

FOREIGN PATENT DOCUMENTS

| | | |
|---|---|---|
| JP | 2018-085097 A | 5/2018 |
| JP | 2020-027596 A | 2/2020 |
| JP | 2021-197167 A | 12/2021 |
| WO | 2015/083678 A1 | 6/2015 |
| WO | 2015/129829 A1 | 9/2015 |
| WO | 2018/221288 A1 | 12/2018 |
| WO | 2020/129346 A1 | 6/2020 |

\* cited by examiner

ELECTRONIC DEVICE

CROSS REFERENCE TO RELATED APPLICATIONS

The present application is a continuation of International application No. PCT/JP2023/004157, filed Feb. 8, 2023, which claims priority to Japanese Patent Application No. 2022-019246, filed Feb. 10, 2022, the entire contents of each of which are incorporated herein by reference.

TECHNICAL FIELD

The present disclosure relates to an electronic device including an operation panel.

BACKGROUND ART

As an disclosure related to a conventional electronic device, for example, a pressing sensor described in Patent Document 1 is known. The pressing sensor includes an operation surface, a plate-shaped member, and a piezoelectric film. A user performs a pressing operation by touching the operation surface. The plate-shaped member becomes bent by the pressing operation. The piezoelectric film is bonded to the plate-shaped member to be bent together with the plate-shaped member. As a result, a pressing force is detected by the output of the piezoelectric film.

Patent Document 1: WO 2015/083678

SUMMARY OF THE DISCLOSURE

By the way, there is a demand for accurately detecting, by the pressing sensor described in Patent Document 1, the magnitude of a force with which the user presses the operation surface.

Therefore, an object of the present disclosure is to provide an electronic device capable of accurately detecting the magnitude of a force with which a user presses an operation panel.

An electronic device according to an embodiment of the present disclosure includes: an operation panel having an upper main surface and a lower main surface that are arranged in a vertical direction such that a part of a body of a user or an operation member is capable of contacting the upper main surface of the operation panel; a buffer member that has an upper main surface and a lower main surface that are arranged in the vertical direction, and is fixed to the lower main surface of the operation panel; a plate-shaped member that has an upper main surface and a lower main surface that are arranged in the vertical direction, and is fixed to the lower main surface of the buffer member; and a sensor that is fixed to the lower main surface of the plate-shaped member and detects deformation of the operation panel, in which a value of a product of a Young's modulus of the plate-shaped member and a cube of a thickness of the plate-shaped member is $1.6 \times 10^{-3}$ N·m to 1.6 N·m.

According to the electronic device according to the present disclosure, the magnitude of a force with which a user presses the operation panel can be accurately detected.

DESCRIPTION OF THE PREFERRED EMBODIMENTS

Embodiment

Figure 1:
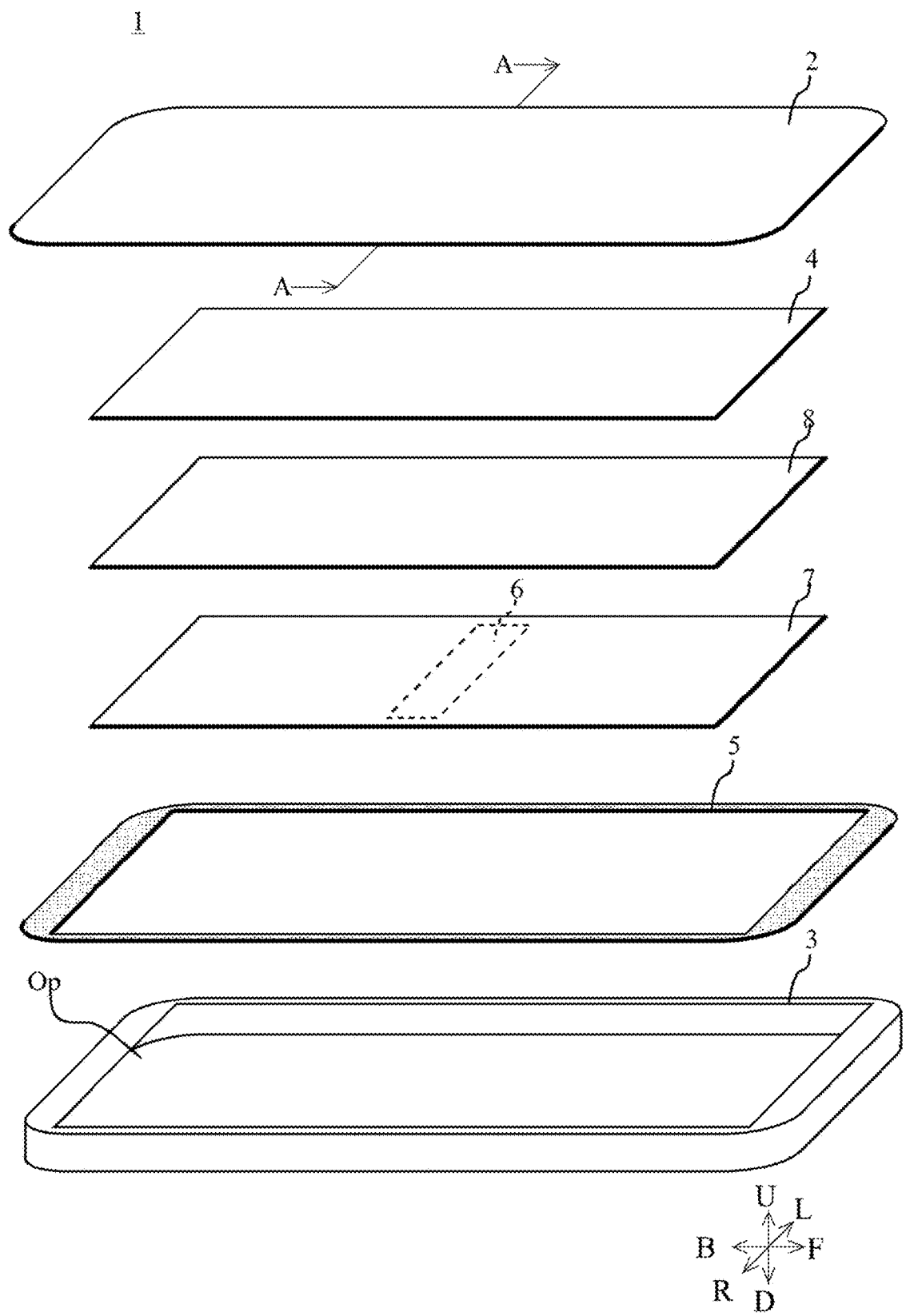
FIG. 1 is an exploded perspective view of an electronic device 1.
Figure 2:
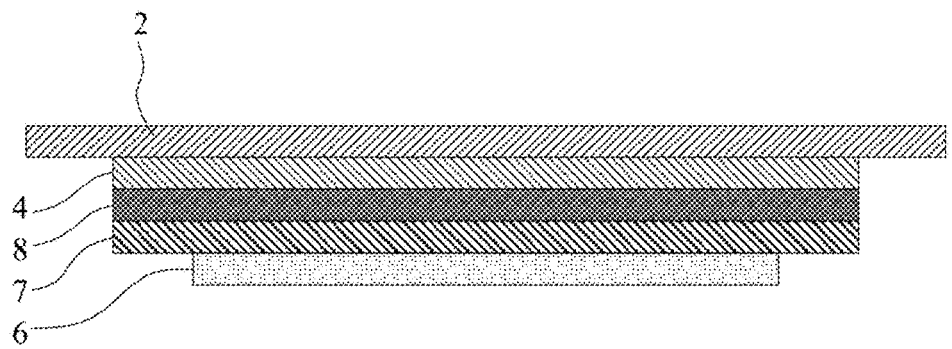
FIG. 2 is a sectional view of the electronic device 1 taken along line A-A.
Figure 2:
Figure 3:
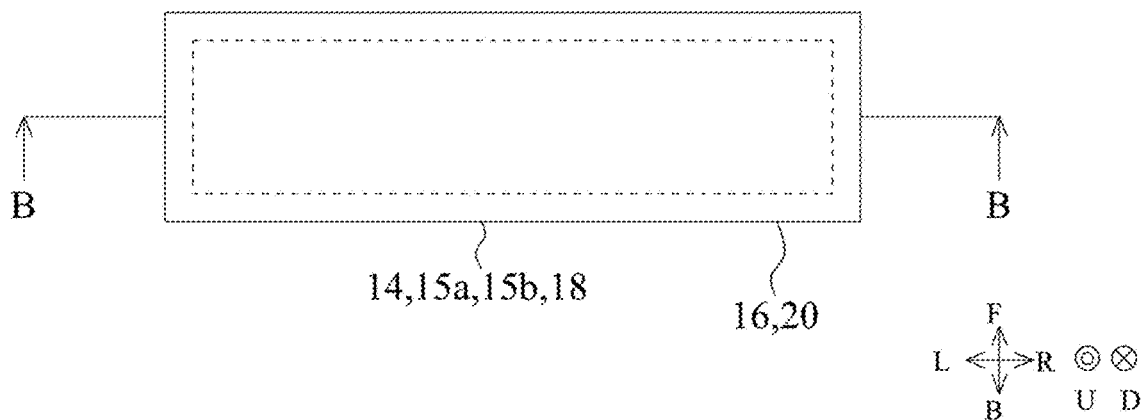
FIG. 3 is a bottom view and a sectional view of a sensor 6.
Figure 3:
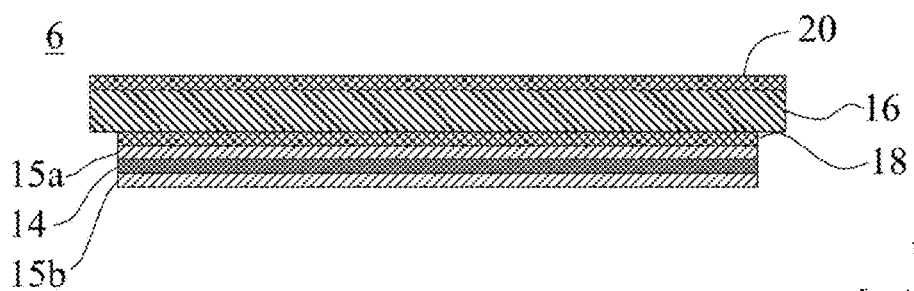
Figure 3:
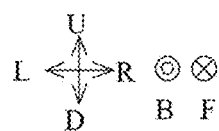

Hereinafter, a configuration of an electronic device 1 according to an embodiment of the present disclosure will be described with reference to the drawings. FIG. 1 is an exploded perspective view of the electronic device 1. FIG. 2 is a sectional view of the electronic device 1 taken along line A-A. FIG. 3 is a bottom view and a sectional view of a sensor 6.

Further, in the present description, directions are defined as follows. In the electronic device 1, a direction in which an upper main surface and a lower main surface of an operation panel 2 are arranged is defined as a vertical direction. As viewed in the vertical direction, a direction in which a long side of the operation panel 2 of the electronic device 1 extends is defined as a front-rear direction. As viewed in the vertical direction, a direction in which a short side of the operation panel 2 of the electronic device 1 extends is defined as a right-left direction. The vertical direction, the right-left direction, and the front-rear direction are orthogonal to each other. Note that the definition of directions in the present description is an example. Therefore, directions at the time of actual use of the electronic device 1 do not need to coincide with the direction as defined herein. Further, the vertical direction may be reversed in FIG. 1. The right-left direction may be reversed in FIG. 1. The front-rear direction may be reversed in FIG. 1.

The electronic device 1 is a portable electronic terminal such as a smartphone or a tablet computer. As illustrated in FIGS. 1 and 2, the electronic device 1 includes the operation panel 2, a housing 3, a display panel 4, an adhesive member 5, the sensor 6, a plate-shaped member 7, and a buffer member 8.

The operation panel 2 has the upper main surface and the lower main surface that are arranged in the vertical direction. The operation panel 2 has a rectangular shape having two long sides extending in the front-rear direction and two short sides extending in the right-left direction as viewed in the vertical direction. A part of a body of a user or an operation member comes into contact with the upper main surface of the operation panel 2. The operation panel 2 is a transparent plate. The operation panel 2 is, for example, a glass plate.

The display panel 4 has an upper main surface and a lower main surface that are arranged in the vertical direction. The display panel 4 has a rectangular shape having two long sides extending in the front-rear direction and two short sides extending in the right-left direction as viewed in the vertical direction. The display panel 4 is fixed to the lower main surface of the operation panel 2. The display panel 4 is fixed to the operation panel 2 with an adhesive, a double-sided tape, or the like. The entire display panel 4 overlaps the operation panel 2 as viewed in the vertical direction. Therefore, the display panel 4 does not protrude from the outer edge of the operation panel 2 as viewed in the vertical direction. The display panel 4 is, for example, an organic EL display or a liquid crystal display. In addition, the display panel 4 may include a touch panel for detecting a position where the user touches the operation panel 2. However, the touch panel may be included in the operation panel 2.

The buffer member 8 has an upper main surface and a lower main surface that are arranged in the vertical direction. The buffer member 8 has a rectangular shape having two long sides extending in the front-rear direction and two short sides extending in the right-left direction as viewed in the vertical direction. The buffer member 8 is fixed to the lower main surface of the operation panel 2. In the present specification, "the buffer member 8 is fixed to the lower main surface of the operation panel 2." means that the buffer member 8 may be directly fixed to the lower main surface of the operation panel 2, or the buffer member 8 may be fixed to another member fixed to the lower main surface of the operation panel 2. In the present embodiment, the buffer member 8 is fixed to the lower main surface of the display panel 4. The buffer member 8 is fixed to the display panel 4 with an adhesive, a double-sided tape, or the like. The entire buffer member 8 overlaps the display panel 4 as viewed in the vertical direction. Therefore, the buffer member 8 does not protrude from the outer edge of the display panel 4 as viewed in the vertical direction.

The buffer member 8 absorbs an impact applied to the electronic device 1. For example, when the electronic device 1 falls and collides with a floor or the like, the operation panel 2 may be deformed and collide with a member in the housing 3 described later. The buffer member 8 absorbs an impact when the operation panel 2 and the member in the housing 3 collide with each other, and suppresses damage to the operation panel 2. Therefore, the buffer member 8 is desirably soft. Specifically, the buffer member 8 desirably have a Young's modulus of 300 kPa or less. The buffer member 8 is, for example, a cushion, a sponge, an impact-absorbing gel, or a double-sided tape.

The plate-shaped member 7 has an upper main surface and a lower main surface that are arranged in the vertical direction. The plate-shaped member 7 has a rectangular shape having two long sides extending in the front-rear direction and two short sides extending in the right-left direction as viewed in the vertical direction. The plate-shaped member 7 is fixed to the lower main surface of the buffer member 8. In the present specification, "the plate-shaped member 7 is fixed to the lower main surface of the buffer member 8." means that the plate-shaped member 7 may be directly fixed to the lower main surface of the buffer member 8, or the plate-shaped member 7 may be fixed to another member fixed to the lower main surface of the buffer member 8. In the present embodiment, the plate-shaped member 7 is fixed to the lower main surface of the buffer member 8. The plate-shaped member 7 is fixed to the buffer member 8 with an adhesive, a double-sided tape, or the like. The entire plate-shaped member 7 overlaps the display panel 4 as viewed in the vertical direction. Therefore, the plate-shaped member 7 does not protrude from the outer edge of the display panel 4 as viewed in the vertical direction. The rigidity of the plate-shaped member 7 is higher than the rigidity of the sensor 6 described later. The material of the plate-shaped member 7 is, for example, metal such as stainless used steel (SUS). However, the material of the plate-shaped member 7 may be a material other than metal. The material other than the metal is, for example, resin.

The housing 3 is located below the operation panel 2. The housing 3 is a box. The housing 3 has a rectangular shape as viewed in the vertical direction. A long side of the housing 3 extends in the front-rear direction. A short side of the housing 3 extends in the right-left direction. The outer edge of the housing 3 viewed in the vertical direction coincides with the outer edge of the operation panel 2 viewed in the vertical direction. An upper face of the housing 3 is open. An opening Op of the housing 3 has a rectangular shape as viewed in the vertical direction. Members such as a battery and a circuit board are stored in the housing 3.

The adhesive member 5 fixes a part of the lower main surface of the operation panel 2 to the housing 3. More specifically, the adhesive member 5 fixes the periphery of the opening Op of the housing 3 to the vicinity of the outer edge of the operation panel 2. Therefore, the adhesive member 5 has a rectangular frame shape surrounding the display panel 4 as viewed in the vertical direction. Therefore, the adhesive member 5 does not overlap the display panel 4 as viewed in the vertical direction. The adhesive member 5 as described above has waterproofness.

The sensor 6 detects deformation of the operation panel 2. As illustrated in FIG. 1, the sensor 6 is fixed to the lower main surface of the plate-shaped member 7. More specifically, the sensor 6 has a rectangular shape as viewed in the vertical direction. The sensor 6 has a longitudinal direction extending in the right-left direction. The sensor 6 is located at the center of the plate-shaped member 7 in the front-rear direction as viewed in the vertical direction.

When the operation panel 2 becomes bent downward due to the pressing of the operation panel 2 by the user, the display panel 4 and the plate-shaped member 7 also become bent downward. Then, the sensor 6 becomes bent downward together with the plate-shaped member 7. As a result, the sensor 6 outputs a detection signal corresponding to the deformation that has occurred in the operation panel 2 when the user presses the operation panel 2. Hereinafter, details of the sensor 6 will be described with reference to FIG. 3.

As illustrated in FIG. 3, the sensor 6 includes a piezoelectric film 14, an upper electrode 15a, a lower electrode 15b, a substrate 16, and adhesive layers 18 and 20. The piezoelectric film 14 has a sheet shape. Therefore, the piezoelectric film 14 has an upper main surface and a lower main surface. A length of the piezoelectric film 14 in the right-left direction is longer than a length of the piezoelectric film 14 in the front-rear direction. In the present embodiment, the piezoelectric film 14 has a rectangular shape having a long side extending in the right-left direction as viewed in the vertical direction. The piezoelectric film 14 generates an electric charge according to an amount of deformation of the piezoelectric film 14. In the present embodiment, the electric charge generated by the piezoelectric film 14 is mainly due to stretching and contraction in the right-left direction. Therefore, it is desirable that a length of the sensor 6 in the lateral direction be 10 mm or less, and the ratio (aspect ratio) of a length of the sensor 6 in the longitudinal direction to the length of the sensor 6 in the lateral direction be 3 to 10. In the present embodiment, the piezoelectric film 14 is a PLA film. The piezoelectric film 14 will be described below in more detail.

The piezoelectric film 14 has a characteristic in which the polarity of an electric charge generated when the piezoelectric film 14 is stretched in the right-left direction is opposite to the polarity of an electric charge generated when the piezoelectric film 14 is stretched in the front-rear direction. Specifically, the piezoelectric film 14 is a film formed of a chiral polymer. The chiral polymer is, for example, poly-lactic acid (PLA), particularly poly-L-lactic acid (PLLA). PLLA, which is a chiral polymer, has a main chain with a helical structure. PLLA has piezoelectricity in which molecules are oriented when the PLLA is uniaxially stretched. The piezoelectric film 14 has a piezoelectric constant of d14. The uniaxial stretching direction (orientation direction) of the piezoelectric film 14 forms an angle of 45 degrees with respect to each of the front-rear direction and the right-left direction. This angle of 45 degrees includes, for example, angles ranging from 45 degrees plus 10 degrees to 45 degrees minus 10 degrees. As a result, the piezoelectric film 14 generates an electric charge when the piezoelectric film 14 is stretched in the right-left direction or contracted in the right-left direction. The piezoelectric film 14 generates a positive charge when the piezoelectric film 14 is stretched in the right-left direction, for example. The piezoelectric film 14 generates a negative charge when the piezoelectric film is contracted in the right-left direction, for example. The magnitude of an electric charge depends on an amount of deformation of the piezoelectric film 14 due to stretching or contraction. More precisely, the magnitude of the electric charge is proportional to a differential value of the amount of deformation of the piezoelectric film 14 due to stretching or contraction.

The upper electrode 15a is a signal electrode. The detection signal is output from the upper electrode 15a. The upper electrode 15a is disposed on the upper main surface of the piezoelectric film 14. The lower electrode 15b is a ground electrode. The lower electrode 15b is connected to the ground. The lower electrode 15b is disposed on the lower main surface of the piezoelectric film 14.

The substrate 16 is disposed on the upper electrode 15a. The substrate 16 holds the piezoelectric film 14, the upper electrode 15a, and the lower electrode 15b, and is deformed together with the piezoelectric film 14. The substrate 16 has a sheet shape. The substrate 16 has an upper main surface and a lower main surface. A length of the substrate 16 in the right-left direction is longer than a length of the substrate 16 in the front-rear direction. In the present embodiment, the substrate 16 has a rectangular shape having a long side extending in the right-left direction as viewed in the vertical direction. The length of the long side of the substrate 16 is equal to or longer than the length of the long side of the piezoelectric film 14, the length of a long side of the upper electrode 15a, and the length of a long side of the lower electrode 15b. The length of a short side of the substrate 16 is equal to or longer than the length of a short side of the piezoelectric film 14, the length of a short side of the upper electrode 15a, and the length of a short side of the lower electrode 15b. The piezoelectric film 14, the upper electrode 15a, and the lower electrode 15b are disposed in a region surrounded by the outer edge of the substrate 16 as viewed in the vertical direction. The material of the substrate 16 is, for example, polyurethane or PET. The substrate 16 may be formed of a flexible substrate or a printed wiring board. In a case where the substrate 16 is a flexible substrate or a printed wiring board, the upper electrode 15a is formed in the flexible substrate or the printed wiring board, and the piezoelectric film 14 is fixed to the substrate 16 by the adhesive layer 18.

The adhesive layer 18 fixes the piezoelectric film 14, the upper electrode 15a, and the lower electrode 15b to the substrate 16. More specifically, the adhesive layer 18 is disposed on the lower main surface of the substrate 16. The adhesive layer 18 covers a part of the lower main surface of the substrate 16. The adhesive layer 18 covers the entire upper main surface of the upper electrode 15a. The outer edge of the adhesive layer 18 is surrounded by the outer edge of the substrate 16 as viewed in the vertical direction. The adhesive layer 18 allows the upper electrode 15a and the substrate 16 to adhere to each other. As a result, the deformation of the substrate 16 is transmitted to the piezoelectric film 14. The material of the adhesive layer 18 is, for example, a double-sided tape, a thermosetting adhesive, or a thermoplastic adhesive.

The adhesive layer 20 is disposed on the upper main surface of the substrate 16. The adhesive layer 20 fixes the substrate 16 to the lower main surface of the plate-shaped member 7. The material of the adhesive layer 20 is, for example, a double-sided tape, a thermosetting adhesive, or a thermoplastic adhesive.

Figure 4:
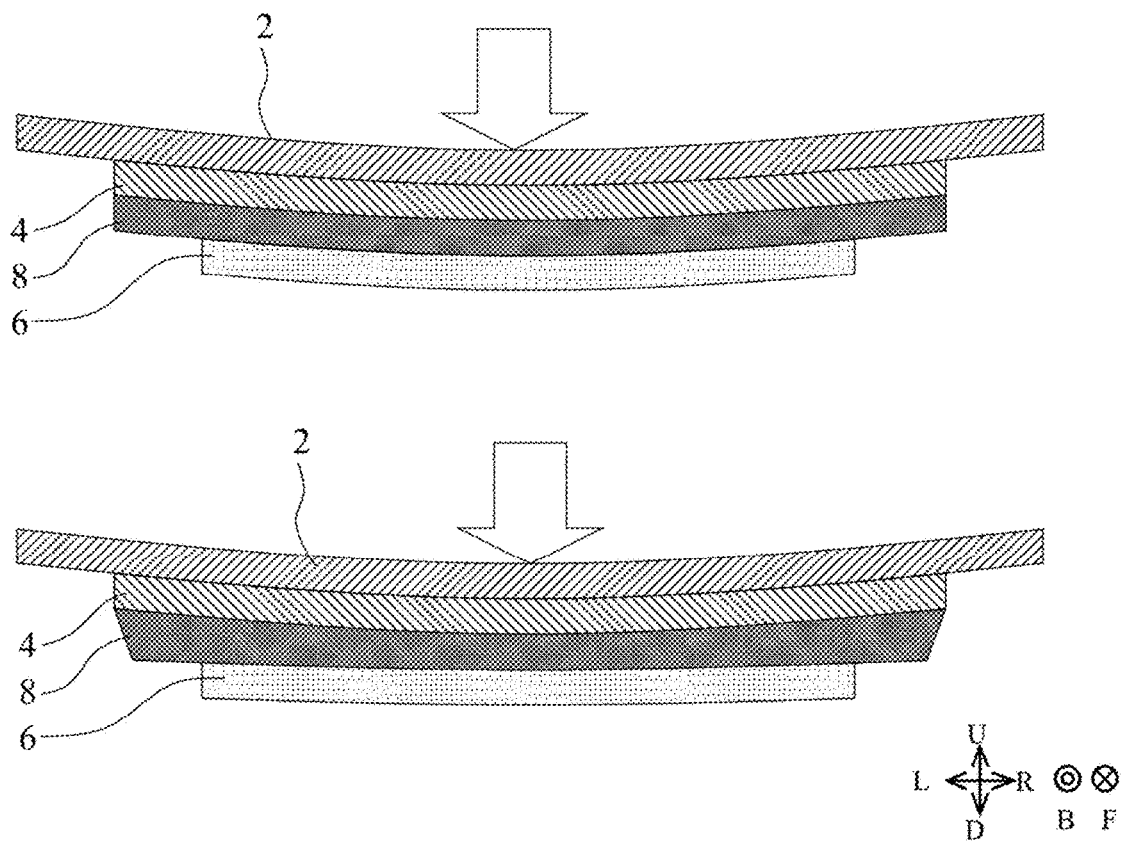
FIG. 4 is a sectional view of an electronic device according to a comparative example.
Figure 5:
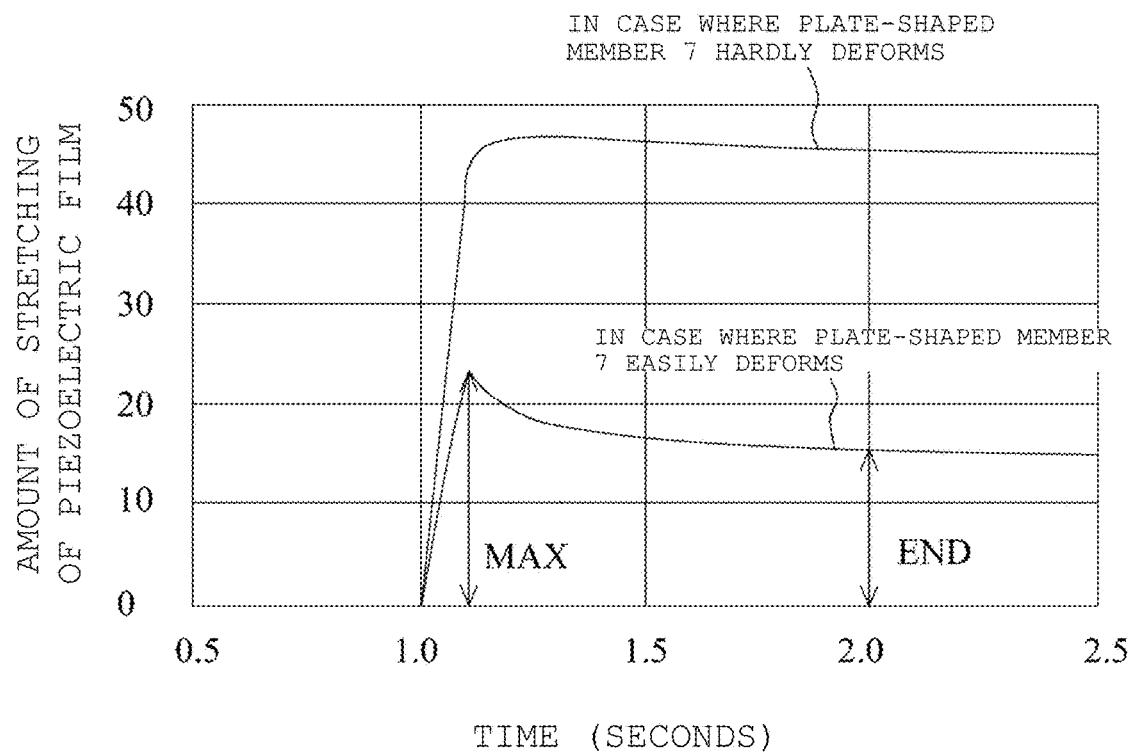
FIG. 5 is a graph illustrating a relationship between an amount of stretching of the piezoelectric film 14 and time.

By the way, the electronic device 1 has a structure capable of accurately detecting the magnitude of a force with which the user presses the operation panel 2. This structure will be described below. FIG. 4 is a sectional view of an electronic device according to a comparative example. FIG. 5 is a graph illustrating a relationship between an amount of stretching of the piezoelectric film 14 and time. The horizontal axis represents time. The vertical axis represents the amount of stretching of the piezoelectric film 14.

The electronic device according to the comparative example does not include a plate-shaped member 7. In this case, in a case where the plate-shaped member 7 has a structure that is easily deformed, overshoot occurs. The occurrence of such overshoot causes a decrease in the accuracy of detecting the magnitude of the force with which the user presses the operation panel 2. The overshoot will be described below.

As illustrated in the upper diagram of FIG. 4, when the user presses the operation panel 2 downward, the operation panel 2 becomes bent so as to protrude downward. At this time, the operation panel 2 extends in a direction orthogonal to the vertical direction. The direction orthogonal to the vertical direction is, for example, the front-rear direction or the right-left direction. The buffer member 8 and the sensor 6 are fixed to the lower main surface of the operation panel 2. Therefore, as illustrated in FIG. 5, the buffer member 8 and the sensor 6 extend in a direction orthogonal to the vertical direction. That is, the piezoelectric film 14 extends in a direction orthogonal to the vertical direction. As a result, the voltage of the detection signal output from the sensor 6 increases.

However, since the buffer member 8 has a structure that is easily deformed, the buffer member 8 tends to return to a planar shape by stress relaxation as illustrated in the lower diagram of FIG. 4. Therefore, the amount of stretching of the piezoelectric film 14 decreases as illustrated in FIG. 5. That is, overshoot occurs.

In addition, in a case where not only the buffer member 8 but also all the members between the operation panel 2 and the sensor 6 have a structure that is easily deformed as viewed in the vertical direction, overshoot occurs. Further, in a case where the display panel 4 and the buffer member 8 have a structure that is easily deformed, overshoot occurs.

Therefore, the electronic device 1 includes the plate-shaped member 7. That is, the electronic device 1 has a structure in which the plate-shaped member 7 to which the sensor 6 is fixed is hardly deformed, and a structure in which members other than the plate-shaped member 7 to which the sensor 6 is fixed are easily deformed. In this case, overshoot hardly occurs. Specifically, the buffer member 8 tries to return to a planar shape by stress relaxation. On the other hand, the plate-shaped member 7 maintains the bending and the extension in the direction orthogonal to the vertical direction. Therefore, in a case where the buffer member 8 tries to return to the planar shape by stress relaxation, the bending of the sensor 6 and the extension in the direction orthogonal to the vertical direction are maintained, and overshoot does not occur.

Figure 6:
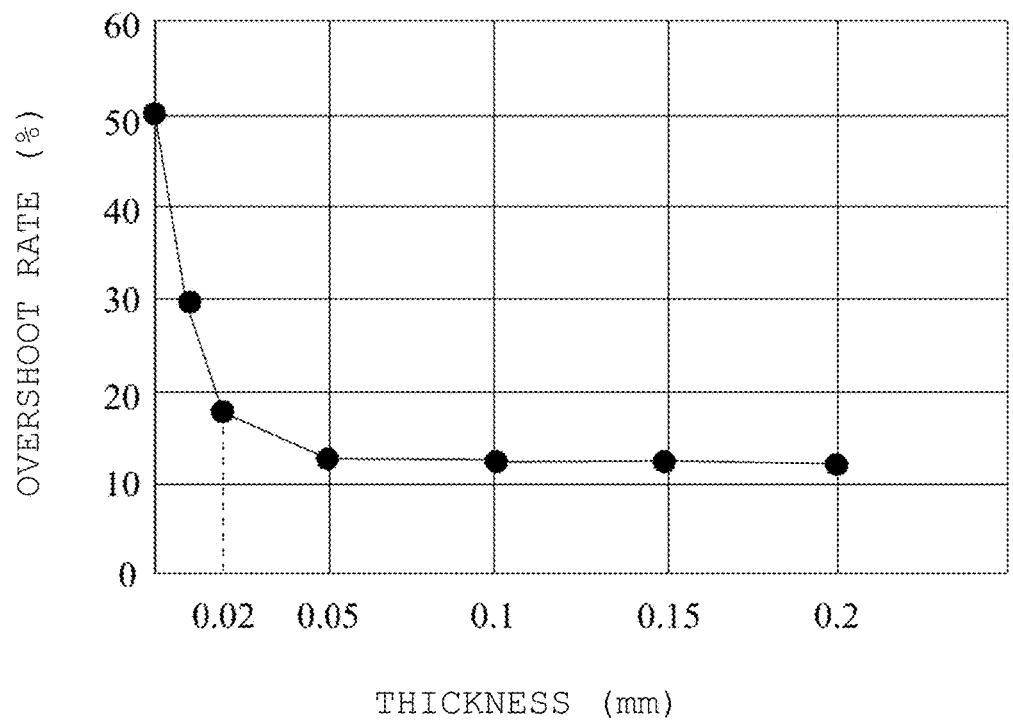
FIG. 6 is a graph illustrating a relationship between a thickness of a plate-shaped member 7 in a vertical direction and an overshoot rate.

Therefore, the inventor of the present application performed computer simulation in order to suppress the occurrence of overshoot. Specifically, the overshoot rate was examined by changing the thickness of the plate-shaped member 7 in the vertical direction in a range of 0 mm to 0.2 mm. As illustrated in FIG. 5, the overshoot rate is a value obtained by multiplying a value obtained by dividing a difference between the maximum value MAX of the amount of stretching of the sensor 6 and the last value END of the amount of stretching of the sensor 6 by the maximum value MAX of the amount of stretching of the sensor 6 by 100. The material of the plate-shaped member 7 is SUS. FIG. 6 is a graph illustrating a relationship between the thickness of the plate-shaped member 7 in the vertical direction and the overshoot rate. The horizontal axis represents the thickness of the plate-shaped member 7 in the vertical direction. The vertical axis represents the overshoot rate.

As illustrated in FIG. 6, it can be seen that when the thickness of the plate-shaped member 7 in the vertical direction is 0.02 mm or more, the overshoot rate is 20% or less. Therefore, the thickness of the plate-shaped member 7 in the vertical direction is preferably 0.02 mm or more. As illustrated in FIG. 6, it has been confirmed that the overshoot rate is sufficiently low particularly when the thickness of the plate-shaped member 7 in the vertical direction is 0.05 mm or more. Thus, in a case where the thickness of the plate-shaped member 7 in the vertical direction is 0.1 mm, the overshoot rate is sufficiently low in consideration of variations during manufacturing. As a result, the electronic device 1 can accurately detect the magnitude of a force with which the user presses the operation panel 2. On the other hand, since the electronic device 1 is required to be thinned, the thickness of the plate-shaped member 7 in the vertical direction is preferably small. Therefore, the thickness of the plate-shaped member 7 in the vertical direction is preferably 0.2 mm or less.

The material of the plate-shaped member 7 is SUS. However, the material of the plate-shaped member 7 is not limited to SUS. The material of the plate-shaped member 7 may be metal or resin. Therefore, a structure of the plate-shaped member 7 capable of reducing the overshoot rate will be described below.

The plate-shaped member 7 being hardly deformed means that the product of the second moment of area of the plate-shaped member 7 and the Young's modulus of the plate-shaped member 7 is large. The second moment of area of the plate-shaped member 7 is proportional to the cube of the thickness of the plate-shaped member 7 in the vertical direction. The Young's modulus of SUS is 200 GPa. In this case, the value of the product of the Young's modulus of the plate-shaped member 7 and the cube of the thickness of the plate-shaped member 7 may be $1.6 \times 10^{-3}$ N·m to 1.6 N·m. As a result, the overshoot rate becomes sufficiently low. That is, the electronic device 1 can accurately detect the magnitude of a force with which the user presses the operation panel 2. However, in a case where the Young's modulus of the plate-shaped member 7 is low, the thickness necessary for sufficiently lowering the overshoot rate increases, and it is difficult to reduce the thickness of the electronic device 1. Therefore, the plate-shaped member 7 preferably has a Young's modulus of 1 GPa or more.

In a case where the Young's modulus of the adhesive layer 20 is low, stress relaxation occurs in the adhesive layer 20, and the overshoot rate increases. In order to set the overshoot rate to 20% or less, the Young's modulus of the adhesive layer 20 is desirably 0.9 MPa or more. In a case where the Young's modulus of the adhesive layer 20 is 10 MPa, the overshoot rate can be sufficiently reduced.

Other Embodiments

The electronic device 1 according to the present disclosure is not limited to the electronic device 1, and can be modified within the scope of the gist thereof.

In the electronic device 1, the piezoelectric film 14 may be a PVDF (polyvinylidene fluoride) film. Further, the piezoelectric film 14 may be piezoelectric ceramic. Further, the piezoelectric film 14 may be a strain sensor.

Note that, in the electronic device 1, the housing 3, the display panel 4, and the adhesive member 5 are not essential components.

Note that the adhesive member 5 may not have waterproofness.

Note that the two sides extending in the front-rear direction may be short sides, and the two sides extending in the right-left direction may be long sides.

Note that the sensor 6 may be disposed at a position other than the center of the plate-shaped member 7 in the front-rear direction as viewed in the vertical direction.

The operation panel 2 may be a resin plate or a printed wiring board.

Note that the sensor 6 may not have the longitudinal direction extending in the right-left direction. The sensor 6 may have a longitudinal direction extending in the front-rear direction.

Note that the electronic device 1 includes the touch panel, but may be a touch pad. In this case, the display panel 4 is unnecessary. The operation panel 2 may not be a transparent member.

Note that the plate-shaped member 7 only needs to cover at least the entire sensor 6 as viewed in the vertical direction, and may not have the two long sides extending in the front-rear direction and the two short sides extending in the right-left direction as viewed in the vertical direction.

DESCRIPTION OF REFERENCE SYMBOLS

1: Electronic device
2: Operation panel
3: Housing
4: Display panel
5: Adhesive member
6: Sensor
7: Plate-shaped member
8: Buffer member
14: Piezoelectric film
15*a*: Upper electrode
15*b*: Lower electrode
16: Substrate
18, 20: Adhesive layer

The invention claimed is:

1. An electronic device comprising:
an operation panel having an upper main surface and a lower main surface that are arranged in a vertical direction such that a part of a body of a user or an operation member is capable of contacting the upper main surface of the operation panel;
a buffer member that has an upper main surface and a lower main surface that are arranged in the vertical direction, and is fixed to the lower main surface of the operation panel;

a plate-shaped member that has an upper main surface and a lower main surface that are arranged in the vertical direction, and is fixed to the lower main surface of the buffer member; and a sensor that is fixed to the lower main surface of the plate-shaped member and detects deformation of the operation panel, wherein a value of a product of a Young's modulus of the plate-shaped member and a cube of a thickness of the plate-shaped member is $1.6 \times 10^{-3}$ N·m to 1.6 N·m.

2. The electronic device according to claim 1, wherein the buffer member has a Young's modulus of 300 kPa or less.

3. The electronic device according to claim 1, wherein the sensor includes:

a piezoelectric film having an upper main surface and a lower main surface that are arranged in the vertical direction;

an upper electrode on the upper main surface of the piezoelectric film; and a lower electrode on the lower main surface of the piezoelectric film.

4. The electronic device according to claim 3, wherein the piezoelectric film is constructed such that a polarity of an electric charge generated by the piezoelectric film when the piezoelectric film is stretched in a right-left direction is different from a polarity of an electric charge generated by the piezoelectric film when the piezoelectric film is stretched in a front-rear direction.

5. The electronic device according to claim 3, wherein the sensor includes a substrate having an upper main surface and a lower main surface that are arranged in the vertical direction, and an adhesive layer fixing the piezoelectric film to the substrate.

6. The electronic device according to claim 5, wherein the adhesive layer has a Young's modulus of 0.9 MPa or more.

7. The electronic device according to claim 1, wherein the thickness of the plate-shaped member in the vertical direction is 0.02 mm to 0.2 mm.

8. The electronic device according to claim 1, wherein the thickness of the plate-shaped member in the vertical direction is 0.05 mm to 0.1 mm.

9. The electronic device according to claim 1, wherein the plate-shaped member has a Young's modulus of 1 GPa or more.

10. The electronic device according to claim 1, further comprising a display panel that has an upper main surface and a lower main surface that are arranged in the vertical direction, and is fixed to the lower main surface of the operation panel, and wherein the buffer member is fixed to the lower main surface of the display panel.

11. The electronic device according to claim 1, wherein each of the operation panel, the buffer member, and the plate-shaped member has a rectangular shape having two long sides extending in a front-rear direction and two short sides extending in a right-left direction as viewed in the vertical direction.

12. The electronic device according to claim 11, wherein the sensor is located at a center of the plate-shaped member in the front-rear direction as viewed in the vertical direction.

13. The electronic device according to claim 12, wherein the sensor has a longitudinal direction extending in the right-left direction.

* * * * *